United States Patent [19]

Schroeder et al.

[11] Patent Number: 5,403,684
[45] Date of Patent: Apr. 4, 1995

[54] PCB TOOLING APPARATUS AND METHOD FOR FORMING PATTERNS IN REGISTRATION ON BOTH SIDES OF A SUBSTRATE

[75] Inventors: Paul E. Schroeder; Michael J. Tobkin, both of Chippewa Falls, Wis.

[73] Assignee: Cray Research, Inc., Eagan, Minn.

[21] Appl. No.: 104,794

[22] Filed: Aug. 11, 1993

[51] Int. Cl.$^6$ .............................................. G03F 9/00
[52] U.S. Cl. ........................................ 430/5; 430/321; 430/322; 430/394
[58] Field of Search ................... 430/5, 322, 394, 321

[56] References Cited
FOREIGN PATENT DOCUMENTS 1-257948  10/1989  Japan .
0013945   1/1991  Japan .

Primary Examiner—S. Rosasco
Attorney, Agent, or Firm—Schwegman, Lundberg & Woessner

[57] ABSTRACT

The present invention includes a tooling apparatus designed to provide accurately aligned printed circuits on both major sides of a printed circuit board layer, especially advantageous for use in multi-layer PCB's. Also disclosed is the method manufacture of the apparatus and the methods of using the apparatus. The apparatus includes patterns formed on glass masks attached to frames incorporating alignment pins and slots. The patterns include registration marks for alignment during manufacture of the apparatus. During use, the apparatus allows accurate alignment of patterns on both sides of a PCB layer. Also disclosed is the apparatus with buttons used to pattern PCB layers having pre-drilled Z-axis holes.

14 Claims, 3 Drawing Sheets

FIG. 1
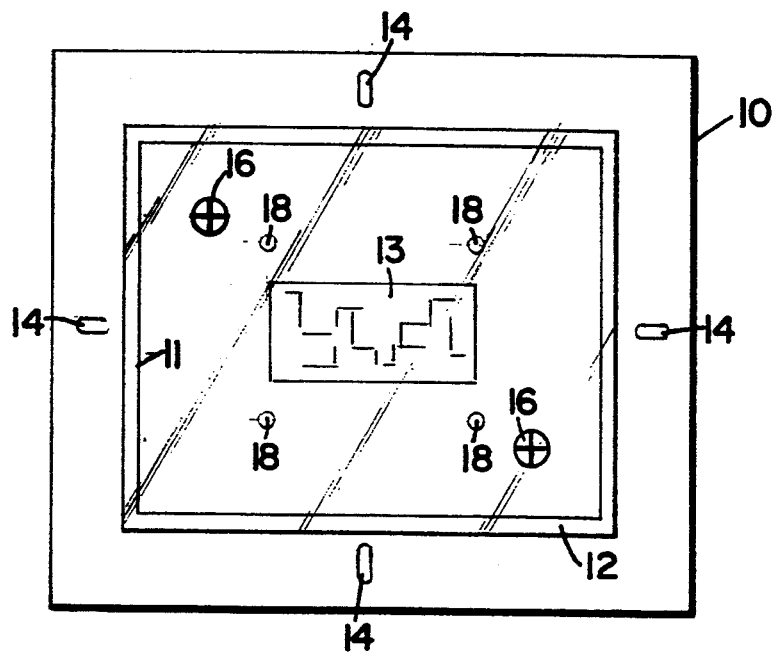
FIG. 3
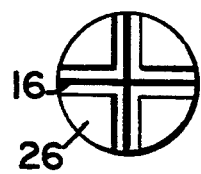
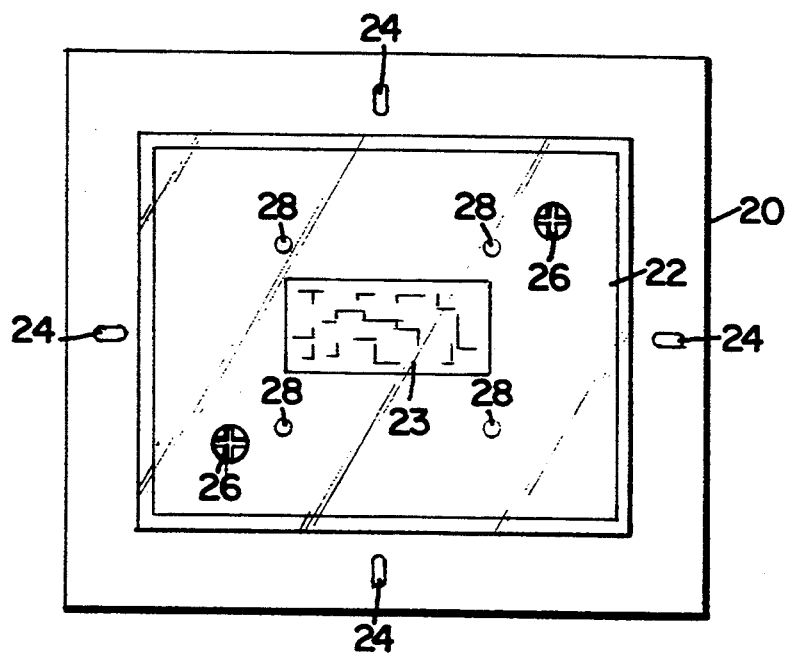
FIG. 2

PCB TOOLING APPARATUS AND METHOD FOR FORMING PATTERNS IN REGISTRATION ON BOTH SIDES OF A SUBSTRATE

FIELD OF THE INVENTION

The present invention relates to an improved printed circuit board tooling apparatus and method. More particularly, the present invention relates to providing improved registration during the printing of circuit board layers used in multi-layer printed circuit board assemblies and the tooling required to provide that improved registration.

BACKGROUND OF THE INVENTION

Known processes of constructing printed circuit board layers include the use of photo-resist material and etching to produce traces and other features on layers which are then built up to produce a finished printed circuit board. During production of each layer it is known to use films of a diazo material with patterns formed on them to expose the photo-resist on printed circuit board layers. In that process, the film is placed on top of the surface to be patterned, and a light source is activated to transfer the pattern from the film to a photo-resist layer coated on the circuit board layer. After exposure, the photo-resist is developed and removed and the circuit board layer is metallized as desired.

That technique does, however, include problems. In particular, the films used to transfer the patterns to the photo-resist layer lack dimensional stability which decreases the accuracy of registration between layers of a multi-layer printed circuit board assembly. Registration accuracy is compromised because the films, typically of thermoplastic materials, have dimensions which change in response to aging and changes in temperature and/or humidity. In addition, the films are also not particularly durable and they may be rendered useless if the pattern on them is damaged during handling. Multi-layer stacked printed circuit boards with two-sided layers, however, require high levels of accuracy in registration because errors in registration compound as more layers are laminated together to produce a desired multi-layer PCB. As a result, the production of multi-layer stacked PCB's has been limited by registration problems.

SUMMARY OF THE INVENTION

The present invention contemplates the use of glass in place of the known diazo film materials for transferring patterns onto photo-resist material. The glass is provided with a layer of metallization into which the pattern to be transferred is etched. Advantages of using glass over the film include an increase in the stability of the material as well as a higher level of durability as compared to the film material.

In addition, the present invention also discloses a novel system of alignment between layers of printed circuit board material. In particular, the system contemplates aligning patterns on both sides of a printed circuit board layer through the use of frames to which patterned glass is attached. Registration accuracy and repeatability are greatly increased by the use of pins which are attached to the frames and which provide a highly accurate alignment/registration system.

The present invention also includes a method of manufacturing the pairs of aligned patterns attached to the frames of the present invention.

BRIEF DESCRIPTION OF THE DRAWINGS

FIG. 1 is a plan view of the lower frame and glass mask;

FIG. 2 is a plan view of the upper frame and glass mask;

FIG. 3 is an enlarged view of the preferred registration marks used to align the patterns;

DETAILED DESCRIPTION OF THE INVENTION

The preferred apparatus, method of manufacturing the apparatus, and method of using the apparatus of the present invention are described below. The preferred apparatus is described first with the methods of manufacturing and using the preferred apparatus following. References are made to FIGS. 1–8 where applicable.

Preferred Apparatus

Figure 4:
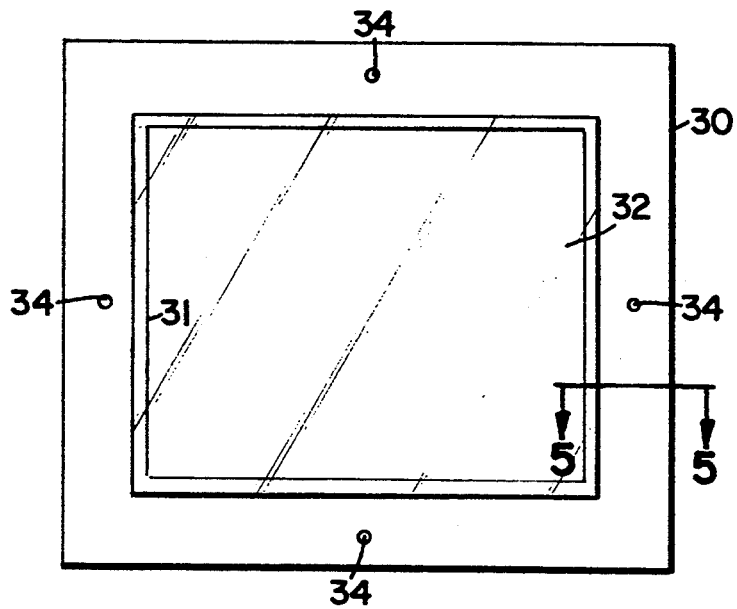
FIG. 4 is a plan view of the vacuum print frame used to provide vacuum during the patterning process.

The preferred apparatus comprises three frames with patterned glass masks attached to the upper and lower frames. Plan views of the three frames are depicted in FIGS. 1, 2 and 4.

Referring to FIG. 1, the lower frame 10 is shown in a plan view. Attached to lower frame 10 is lower glass mask 12 which is attached over the opening 11 in lower frame 10 Lower frame 10 also includes four alignment slots 14 which are used to align the lower frame with vacuum print frame 30 of FIG. 4 using alignment pins 34 as is further described below.

Although the preferred embodiment discloses four alignment slots 14, it will be understood that three slots would be sufficient to locate any additional frames above lower frame 10, while the use of more than four slots would also fall within the scope of the present invention. It will be understood that slots 14 could be in any appropriate shape necessary to receive alignment pins 34 of the vacuum print frame 30. Although the preferred alignment pins 34 are circular, slots 14 are elongated in the preferred embodiment to ease assembly of the lower frame 10 to the vacuum print frame 30.

Lower frame 10 is preferably fabricated from aluminum having a thickness of 0.25" (±0.02") with a planarity of 0.001". The aluminum is preferably anodized to prevent optical aberrations during printing because of the high reflectivity of uncoated aluminum. Other coatings that accomplish the same purpose could also be substituted.

Glass mask 12 preferably contains a metallized pattern 13 formed on its surface. Pattern 13 is formed from a 500 Å layer of chromium on the glass 12 which is etched to form pattern 13 which will be transferred to a circuit board layer. Other materials could be substituted for the preferred chromium layer to form pattern 13 on glass 12.

Also disclosed in FIG. 1 are registration marks 16 on glass mask 12. In the preferred embodiment, registration mark 16 comprises a "cross-hair" mark which is aligned in the x and y directions to pattern 13 formed on the glass 12. Like pattern 13, mark 16 is formed by etching the metallization layer formed on the glass 12. The use of registration mark 16 will be described further below with respect to FIG. 3.

Referring to FIG. 2, an upper frame of the apparatus of the present invention is disclosed. Upper frame 20 includes upper glass mask 22 which is attached over opening 21 formed in upper frame 20.

Upper frame 20 includes alignment slots 24 on each of its four sides. The slots 24 are adapted to receive alignment pins 34 of vacuum print frame 30 as is more fully described below. It will be understood that slots 24 could be in any appropriate shape necessary to receive alignment pins 14. Although the preferred alignment pins 34 are circular, slots 24 are formed in the shape of slots in the preferred embodiment to ease assembly of the upper frame 20 to the vacuum print frame 30.

Upper frame 20 is preferably fabricated from aluminum having a thickness of 0.25" (±0.02") with a planarity of 0.001". The aluminum is preferably anodized to prevent optical aberrations during printing because of the high reflectivity of uncoated aluminum. Other coatings that accomplish the same purpose could also be substituted.

Like lower glass mask 12, upper glass mask 22 preferably contains a metallized pattern 23 formed on its surface. Pattern 23 is formed from a 500 Å layer of chromium on the glass 22 which is etched to form pattern 23 which will be transferred to a circuit board layer. Other materials could be substituted for the preferred chromium layer to form pattern 23 on glass 22.

Similar to glass mask 12, metallized pattern 23 also includes registration marks 26 formed on its surface. Registration marks 26 are adapted to cooperate with registration marks 16 in pattern 13 to provide a highly accurate system of aligning lower glass mask 12 with upper glass mask 22. That feature is essential to align the patterns formed on each glass mask, ensuring that those patterns, as transferred to a printed circuit board layer, will be in registration with each other.

Referring to FIG. 3, the cooperation between registration mark 16 on glass mask 12 and registration mark 26 on glass mask 22 is depicted. As shown there, registration mark 16, in its preferred embodiment, comprises a cross-hair disposed within a circle. Registration mark 26 comprises a reverse image cross-hair in which the clear portions are wider than the width of the solid cross-hairs of registration mark 16. The difference in widths allows alignment of the registration marks to a high degree of accuracy. The preferred cross-hairs of mark 16 are 3.5 mils wide while the clear areas of the reverse image cross-hair of mark 26 are preferably 4.0 mils wide. The exact process used in aligning these marks is described with respect to the preferred method of manufacture below.

FIG. 4 depicts the vacuum print frame of the preferred embodiment of the apparatus of the present invention. Vacuum print frame 30 includes opening 31 in its center which corresponds substantially to the openings in both the lower and upper frames as described above. Vacuum print frame 30 also includes alignment pins 34 which are adapted to fit within the alignment slots 14 of the lower frame 10 and the alignment slots 24 of the upper frame 20. The pins 34 are preferably circular in cross-section, but can take any appropriate shape as discussed with respect to slots 14 and 24.

Proximate both sides of the opening 31 of vacuum print frame 30 are gaskets 32 used to provide a substantially air tight seal between the glass masks 12 and 22 and the vacuum print frame when the lower glass 12 and upper glass 22 are placed on either side of vacuum print frame 30.

Figure 5:
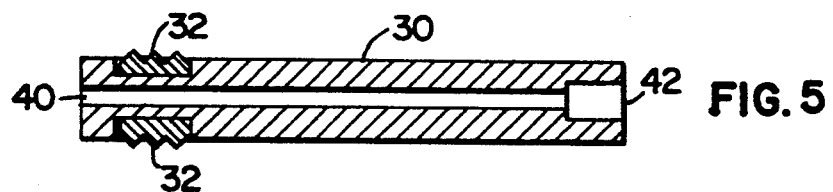
FIG. 5 is an enlarged cross-sectional view of the vacuum print frame of FIG. 4 along line A—A.

Referring to FIG. 5, a cross-section of vacuum print frame 30 is shown along lines 5—5 in FIG. 4. As shown there, gaskets 32 are disposed on each side of vacuum print frame 30. An evacuation bore 40 extends through vacuum print frame 30 and terminates in a vacuum fitting 42 on the outside edge of the frame 30. Vacuum fitting 42 can be attached to a vacuum source which is not shown.

Figure 6:
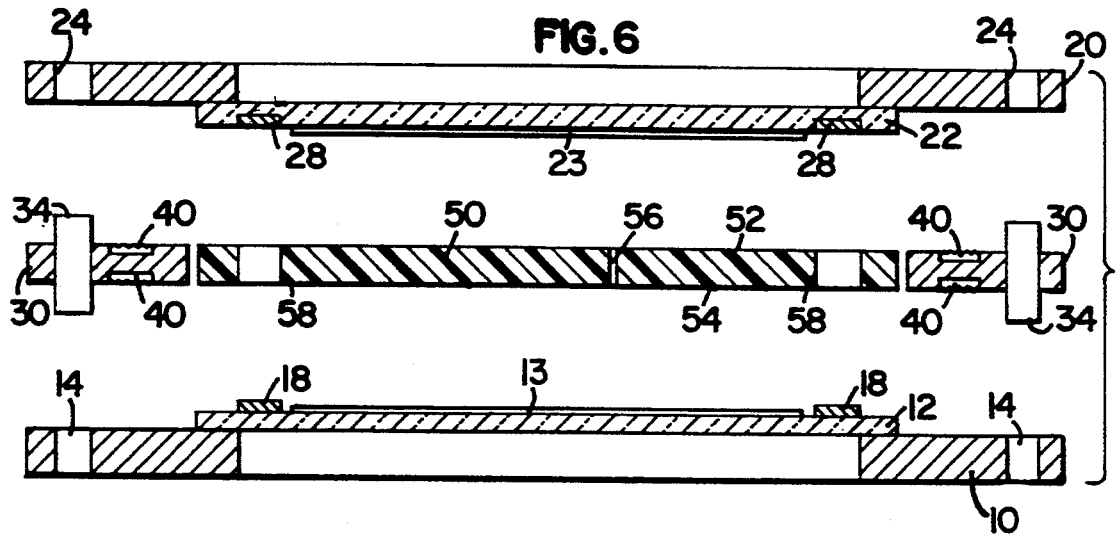
FIG. 6 is an exploded cross-sectional view of one embodiment of the preferred process.

Referring to FIG. 6, an exploded cross-sectional view of the lower frame 10 and vacuum print frame 30 and upper frame 20 are shown. As depicted there, lower frame 10 and attached glass mask 12 are located at the lower part of the assembly with the metallized pattern 13 facing upward. Vacuum print frame 30 with its related parts is then fit on top of lower frame 10 with alignment pins 34 being received in alignment slots 14.

A printed circuit board layer 50 is placed in the opening 31 formed in the center of vacuum print frame 30. Printed circuit board layer 50 includes a core section 54 coated on both sides by a layer of photo-resist material 52 which will be patterned by the metallized patterns on glass masks 12 and 22. Upper frame 20 is placed on top of vacuum print frame 30 with glass mask 22 facing printed circuit board layer 50 and pins 34 being received within alignment slots 24 of upper frame 20.

Also in the preferred embodiment illustrated in FIGS. 1 and 6, lower glass mask 12 can include buttons 18 attached to its metallized surface for use in aligning pattern features with pre-drilled Z-axis holes 56 in the PCB layer 50 as described more fully below. The preferred embodiment includes four such buttons 18, although it will be recognized that three or more buttons would be sufficient to accurately locate a panel on mask 12. In this embodiment, upper glass mask 22 also includes relief voids 28 in its surface to receive at least a portion of the buttons on lower mask 12 during alignment of the apparatus as described more fully below. Printed circuit board layer 50 is provided with holes 58 formed through its thickness. Holes 58 are adapted to receive buttons 18, thereby aligning the metallized patterns with the pre-drilled Z-axis holes 56.

Preferred Method of Manufacture

The preferred method of manufacturing the tooling apparatus described above begins with providing upper and lower glass masks 12 and 22, each having a metallized surface onto which patterns 13 and 23 are etched. The pattern on the lower mask 12 includes lower registration marks 16 while the pattern on the upper mask 22 includes upper registration marks 26 both as described above.

The lower mask 12 is bonded to lower frame 10 which is provided with an opening 11 in its center which corresponds substantially to the pattern on lower mask 12. Both upper 22 and lower 12 masks are preferably attached to their respective frames using epoxy although it will be understood that many other means of attachment could be substituted. Alignment of lower mask 12 on lower frame 10 is not critical as long as the pattern on lower mask 12 is substantially centered within opening 11 in lower frame 10.

Lower frame 10 is provided with alignment slots 14 located around its circumference for aligning vacuum print frame 30 with lower frame 10 using pins 34 attached to vacuum print frame 30. As discussed above, the slots 14 can take any shape, although the preferred shape is depicted in FIG. 1.

Figure 7:
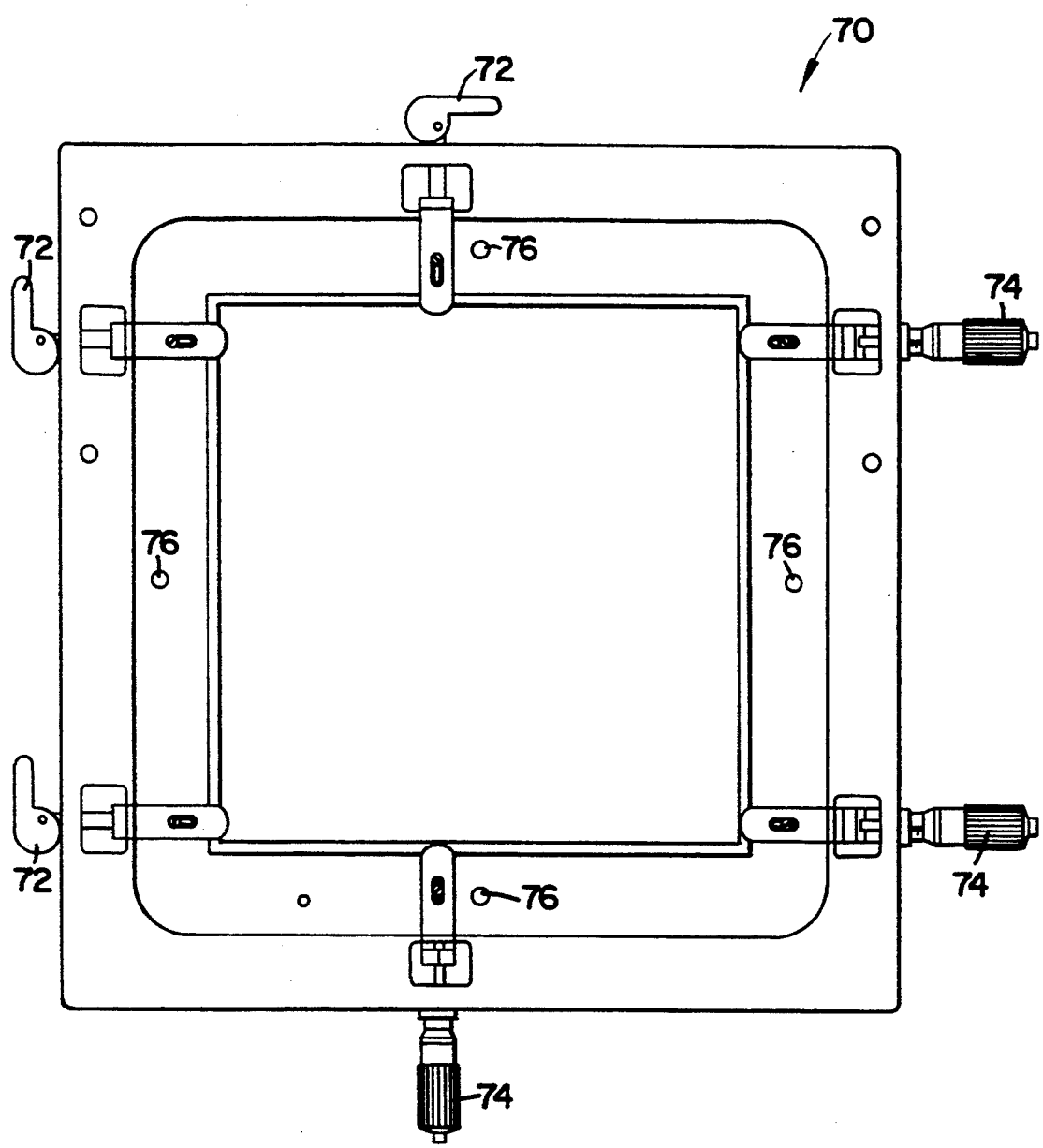
FIG. 7 is a top view of the alignment fixture used to manufacture the apparatus of the present invention.

Referring to FIG. 7, after lower mask 12 is attached to lower frame 10, the lower assembly is attached to the lower side of alignment fixture 70 which is used to align the upper mask 22 with lower mask 12. The lower frame 10 is attached to fixture 70 with lower mask 12 facing upwards. Fixture 70 includes alignment pins 76 located in the same position, relative to each other, as the pins 34 are located in vacuum print frame 30. In that way, alignment of lower mask 12 to upper mask 22 on fixture 70 can be repeated using an appropriate vacuum print frame 30 when a printed circuit board layer 50 is imaged using lower mask 12 and upper mask 22. The pins 76 are aligned relative to each other to an accuracy of $\pm 0.0001$ inches in the preferred fixture 70 and vacuum print frame 30. The pins 76 protrude above and below alignment fixture 70, to cooperate with alignment slots 14 of the lower frame 10 and alignment slots 24 of upper frame 20.

After lower frame 10 and mask 12 are in place on fixture 70, upper mask 22 is then placed on the upper surface of fixture 70 with its metallized pattern 23 facing and in contact with the metallized pattern 13 of lower mask 12. Upper mask 22 is then aligned to lower mask 12 using spring-loaded toggle clamps 72 and micrometer adjusters 74 located around the sides of upper mask 22. As shown in FIG. 7, the preferred alignment fixture 70 includes two spring-loaded toggle clamps 72 on one side of mask 22, with two micrometer adjustors 74 located on the opposite side of mask 22. Along the remaining two sides of mask 22 are a single micrometer adjuster 74 or spring-loaded toggle clamp 72 as depicted.

After upper mask 22 is in place, its pattern is visually aligned with the pattern on lower mask 12. After rough visual alignment, a magnified vision system (not shown) is used to complete fine alignment of the patterns to each other. As described above and depicted in FIG. 3, lower registration marks 16 preferably consist of an opaque cross-hair contained within a circle while upper registration marks 26 consist of reverse image cross-hairs. When aligning the upper and lower patterns, lower registration mark 16 is aligned within upper registration mark 26 such that the opaque lines of lower registration mark 16 fit within the clear areas of upper registration mark 26, with equal spacing on all sides.

Because the opaque lines of lower registration mark 16 are thinner than the width of the clear areas of upper registration marks 26, the upper 22 and lower 12 masks can be accurately aligned.

That alignment is typically accurate to approximately 0.0002 inch, thereby placing the upper and lower patterns 13 and 23 into highly accurate alignment with respect to one another. Because of the novel use of pins 18 involved in this invention, that accuracy is not compromised as the patterns 13 and 23 are used to image printed circuit board layers.

If the apparatus being manufactured is to be used with pinned panels having pre-drilled Z-axis holes 56 then the buttons 18, shown in FIG. 1, must be mounted on the lower glass mask 12. The buttons 18 are mounted on such glass using a template (not shown) which has holes drilled into it for receiving the buttons while allowing them to lay on the patterned surface of lower glass mask 12. The template also has registration marks similar to those found on upper mask 22 for precision alignment with lower mask 12 using the process described above. The buttons 18 are then glued into position after they are aligned on lower glass mask 12.

Figure 8:
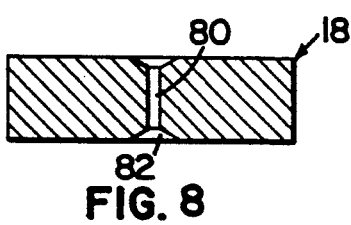
FIG. 8 is an enlarged cross-section view of a button used in the present invention.

The cross-section of a typical button 18 used in the preferred apparatus is shown in FIG. 8 where it is seen that a through-hole 80 is provided in the button which is chamfered 82 at its lower surface. The button is glued to the glass masks using epoxy which is provided into the through-hole 80. The epoxy then moves down the through-hole 80 and collects in the chamfered area of the button 18. The chamfering allows a more secure attachment of the button to lower glass mask 12.

Upper glass mask 22 is preferably provided with relief holes 28 formed in it which allow upper glass mask 22 to lie directly on top of lower glass mask 12. The relief holes 28 are sized to receive the buttons 18. In that way, alignment of upper mask 22 is not compromised by the buttons 18, which would otherwise prevent upper mask 22 from lying directly above and in contact with lower mask 12.

After buttons 18 are in place, the upper frame 20 is attached to upper mask 22 using epoxy or another suitable means of attachment. Upper frame 20 is, of course, aligned with pins 76 on fixture 70 using slots 24. That process ensures accurate alignment when used with a vacuum print frame 30 and its associated pins 34.

Once manufactured, each matching pair of upper 22 and lower 12 masks can then be used in the preferred method described below to produce highly accurately aligned printed circuit board layers for use in multilayer printed circuit boards.

Preferred Method of Use

The first preferred method of imaging can be visualized by referring to FIG. 6. As shown there, vacuum print frame 30 and alignment pins 34 are used to align upper frame 20 and lower frame 10. When assembled, glass masks 12 and 22 are disposed against the surface of printed circuit board layer 50 which lies within the void 31 in vacuum print frame 30. The metallized patterns 13 and 23 on glass masks 12 and 22 are preferably in direct contact with the photo-resist on both surfaces 52 and 54 of the printed circuit board layer 50. After assembly, a vacuum is drawn through the vacuum fitting 42 in vacuum print frame 30. That vacuum urges glass masks 12 and 22 into intimate contact with the photo-resist on printed circuit board layer 50. The vacuum feature is important because the proximity of the metallized patterns 13 and 23 to photo-resist greatly enhances the accuracy of the transferred pattern by minimizing both diffraction and refraction errors.

When assembled and with a vacuum drawn, both sides of the assembly are exposed to the appropriate light source needed to expose the photo-resist layers 52 and 54. In that way, the photo-resist on both surfaces 52 and 54 is patterned with the corresponding patterns of glass masks 12 and 22. After exposure, the photo-resist is developed and the panels 50 are then metallized in the appropriate patterns.

One preferred method also includes steps for aligning pre-drilled Z-axis holes 56 in the panels 50 with appropriate features in the patterns 13 and 23 on the glass masks 12 & 22, typically contact pads. The buttons 18 attached to the lower glass 12 are received into corresponding relief holes 58 in the panel 50 to align the pre-drilled Z-axis holes 56 with the patterns formed on panels 50. Such "pinning" of panels to align pre-drilled holes with patterns is known in the art. The present invention, however, incorporates the pinning technique into the methods of aligning the patterns using the alignment frames to which the glass masks are attached.

In the preferred method, the panels 50 are placed in a drilling fixture (not shown) which includes buttons 18 placed in the same locations as those found on glass mask 12. After placement, Z-axis holes 56 are drilled in locations where required and which correspond to contact pads formed during metallization. After drilling, the panels 50 are placed between matched pairs of glass masks 12 and 22 with attached buttons 18 (to align the pre-drilled Z-axis holes with pattern features, such as contact pads) and patterned in the same manner as described above. In that way, the Z-axis holes 56 are aligned with the patterns formed on both sides of PCB layer 50.

The foregoing descriptions of the preferred apparatus and methods of the present invention have been presented for the purposes of illustration and description. They are not intended to be exhaustive or to limit the invention to the precise apparatus or methods disclosed. Many modifications and variations are possible in light of the above teachings. It is intended that the scope of the invention be limited not by this detailed description, but rather by the attached claims.

We claim:

1. A method of patterning a printed circuit board layer coated on upper and lower major surfaces with a photoresist material, said method comprising the steps of:
   a) providing a lower glass mask having a lower pattern formed thereon;
   b) placing said lower glass mask proximate said lower major surface of said printed circuit board layer;
   c) providing an upper glass mask having an upper pattern formed thereon;
   d) placing said upper glass mask proximate said upper major surface of said printed circuit board layer;
   e) registering said upper pattern relative to said lower pattern before said steps of placing said upper glass mask and placing said lower glass mask;
   f) exposing said photoresist material on said upper and lower major surfaces as desired according to said upper and lower patterns of said upper and lower glass masks.

2. The method of claim 1, further comprising the step of providing vacuum between said lower glass mask and said lower major surface and between said upper glass mask and said upper major surface, said vacuum urging said upper and lower glass masks against said upper and lower major surfaces, respectively.

3. The method of claim 1, further comprising the steps of:
   a) providing said printed circuit board layer having a Z-axis hole; and
   b) aligning said Z-axis hole with said upper and lower patterns.

4. The method of claim 3, wherein said step of aligning said Z-axis hole further comprises:
   1) providing a raised protrusion and corresponding relief void in said upper and lower glass masks; and
   2) providing a void in said printed circuit board layer, said void receiving said raised protrusion to align said Z-axis hole with said upper and lower patterns.

5. A method of manufacturing a pair of masks for patterning photoresist material on upper and lower major surfaces of a printed circuit board layer, said method comprising:
   a) providing a lower glass mask having a lower pattern formed thereon and an upper glass mask having an upper pattern formed thereon;
   b) providing upper and lower frames;
   c) attaching said lower glass mask to said lower frame;
   d) aligning said upper and lower frames relative to each other;
   e) registering said upper and lower patterns relative to each other;
   f) attaching said upper pattern to said upper frame after said steps of aligning said upper and lower frames and registering said upper and lower patterns.

6. The method of claim 5, wherein the step of aligning said upper and lower frames further comprises:
   1) providing an alignment frame having at least three alignment pins protruding from said alignment frame; and
   2) providing at least three voids in each of said upper and lower frames, each of said voids corresponding to one of said alignment pins for receiving said alignment pins; whereby said upper and lower frames are aligned with each other when each of said voids receives one of said alignment pins.

7. The method of claim 5, wherein said step of registering said upper and lower patterns further comprises:
   1) providing a registration mark on one of said upper and lower glass masks;
   2) providing a reverse image registration mark on said lower or upper glass mask which does not include said registration mark; and
   3) centering said registration mark with respect to said reverse image registration mark; whereby said upper and lower patterns on said upper and lower glass masks are registered with respect to each other.

8. The method of claim 7, wherein said step of providing a registration mark further comprises providing a cross-hair registration mark and further wherein said step of providing a reverse image registration mark further comprises providing a reverse cross-hair registration mark.

9. The method of claim 5, further comprising the step of providing a vacuum frame for use with said upper and lower frames in providing vacuum between said upper and lower glass masks.

10. The method of claim 9, wherein the step of aligning said upper and lower frames further comprises:
    1) providing at least three alignment pins protruding from said vacuum frame; and
    2) providing at least three voids in each of said upper and lower frames, each of said voids corresponding to one of said alignment pins for receiving said alignment pins; whereby said upper and lower frames are aligned with each other when each of said voids receives one of said alignment pins.

11. The method of claim 5, further comprising the steps of:
    a) providing a raised protrusion on either of said upper or lower glass masks;

b) providing a relief void in said upper or lower glass mask which does not include said raised protrusion, said relief void receiving said protrusion when said upper and lower glass patterns are aligned with each other.

12. A method of patterning a printed circuit board layer coated on upper and lower major surfaces with a photoresist material, said method comprising the steps of:

a) providing a lower glass mask having a lower pattern formed thereon and an upper glass mask having an upper pattern formed thereon;
   b) providing upper and lower frames;
   c) attaching said lower glass mask to said lower frame;
   d) aligning said upper and lower frames relative to each other;
   e) registering said upper and lower patterns relative to each other;
   f) attaching said upper pattern to said upper frame after said steps of aligning said upper and lower frames and registering said upper and lower patterns;
   g) placing said lower glass mask proximate said lower major surface of said printed circuit board layer;
   h) placing said upper glass mask proximate said upper major surface of said printed circuit board layer;
   i) aligning said upper pattern relative to said lower pattern using said upper and lower frames;
   j) exposing said photoresist material on said upper and lower major surfaces as desired according to said upper and lower patterns of said upper and lower glass masks.

13. The method of claim 12, further comprising the steps of:

a) providing said printed circuit board layer having a Z-axis, hole; and
   b) aligning said Z-axis hole with said upper and lower patterns.

14. The method of claim 13, wherein said step of aligning said Z-axis hole further comprises:

1) providing a raised protrusion and corresponding relief void in said upper and lower glass masks; and
   2) providing a void in said printed circuit board layer, said void receiving said raised protrusion to align said Z-axis hole with said upper and lower patterns.

* * * * *